United States Patent [19]
Parekh et al.

[11] Patent Number: 6,060,351
[45] Date of Patent: May 9, 2000

[54] PROCESS FOR FORMING CAPACITOR OVER BIT LINE MEMORY CELL

[75] Inventors: Kunal R. Parekh; John K. Zahurak, both of Boise, Id.

[73] Assignee: Micron Technology, Inc., Boise, Id.

[21] Appl. No.: 08/998,023

[22] Filed: Dec. 24, 1997

[51] Int. Cl.[7] .................................................. H01L 21/8242
[52] U.S. Cl. .......................................... 438/253; 438/672
[58] Field of Search ..................... 438/253–256, 438/390–399, 672, 675

[56] References Cited

U.S. PATENT DOCUMENTS

| | | |
|---|---|---|
| 5,296,400 | 3/1994 | Park et al. . |
| 5,401,681 | 3/1995 | Dennison . |
| 5,721,154 | 2/1998 | Jeng . |
| 5,789,304 | 8/1998 | Fischer et al. . |
| 5,792,687 | 8/1998 | Jeng et al. . |

*Primary Examiner*—Jey Tsai
*Attorney, Agent, or Firm*—Dickstein Shapiro Morin & Oshinsky

[57] ABSTRACT

A stacked capacitor memory cell and method for its fabrication including providing a layer of insulation glass over word lines on a silicon semiconductor substrate; self-aligning contact holes at the storage nodes and bit line contact location; providing a blanket layer of polysilicon, then silicide, and then an insulating cap; removing a portion of the insulating cap, silicide and polysilicon to form polysilicon plugs having outward surfaces at an elevation below the surface of the insulating glass, thus forming the bit line, a bit line contact and isolating the storage nodes; and providing a stacked capacitor on top of the bit line and in electrical communication with the storage node contact location through the plugs formed simultaneously with the bit line and bit line contact.

24 Claims, 8 Drawing Sheets

PROCESS FOR FORMING CAPACITOR OVER BIT LINE MEMORY CELL

FIELD OF THE INVENTION

This invention relates generally to capacitor over bit line structures for memory cells, such as dynamic random access memory (DRAM) cells, and to methods for fabricating such structures and cells.

BACKGROUND OF THE INVENTION

As memory cell density increases, there is a continuing challenge to maintain sufficiently high storage capacitance despite decreasing cell area. One way of increasing cell capacitance is through three-dimensional cell capacitor structures, such as trenched or stacked capacitors.

Stacked capacitor DRAMs utilize either a buried bit line or a non-buried bit line structure. With buried bit line structures, bit lines are provided in close vertical proximity to the bit line contacts of the memory cell field effect transistors (FETs), and the cell capacitors are formed horizontally over the top of the word lines and bit lines. Buried bit line structures, sometimes referred to as capacitor-over-bit-line (COB) structures, are the subject of this invention.

Sim et al., "A New Planar Stacked Technology (PST) for Scaled and Embedded DRAMs," IEEE, IEDM 96-597-600 (1996), refers to a COB type DRAM structure made by a process of inserting a connecting layer between a storage node contact and a gate polysilicon layer. After formation of a tungsten damascene bit line, the storage node contact is opened and a polysilicon plug is formed by deposition and etch-back. Capacitors are formed by oxide etch selective to storage node hole formation, followed by polysilicon deposition and CMP for cylindrical capacitor definition. The cell plate is then patterned, followed by W-plug CMP and metalization.

M. Sakao et al., "A Capacitor-Over-Bit-Line (COB) Cell with a Hemispherical-Grain Storage Node for 64 Mb DRAMs," IEEE, IEDM 90-655-658 (1990), refers to a process for making a COB cell wherein, after opening a self-aligned contact to the active area, a polysilicon layer is formed as a local interconnect. After an insulating interlayer deposition, a bit line contact is opened and filled with a doped polysilicon plug. A polycide bit line is then formed, and an insulating interlayer is deposited on the bit line and planarized. After opening the capacitor contact, an HSG polysilicon storage node is formed and connected to the active area through the capacitor contact and local interconnect.

The goal of increasing or, at least, maintaining cell capacitance as cell size shrinks must be attained without resorting to processes that increase the number of masking, deposition, etch and other steps in the production process. This has a great impact on manufacturing costs, particularly the costs of photolithographic steps. High capital costs are associated with photolithographic equipment and more complex photo processing, in terms of more photo process steps per level, more equipment, and the use of expensive ultra clean room floor space. Defect density is inevitably increased with each additional photomasking layer and compromises yield and reliability. All photo layers also require a subsequent step, either implant or etch. These additional steps further add to manufacturing costs.

What is needed is a capacitor over bit line cell of reduced complexity that can be fabricated with a minimum of process steps.

SUMMARY OF THE INVENTION

It is an object of the present invention to provide a method for fabricating a buried bit line stacked-capacitor memory cell by a process that reduces the number of photomasking and etching steps.

A further object of the present invention is to provide a method for fabricating a buried bit line memory cell having a bit line, plugs for the future capacitors, and plugs of slots in the periphery for shallower contacts, which can all be formed in a single processing step.

Yet a further object of the present invention is to provide a DRAM cell with a stacked capacitor over silicided bit line structure having reduced complexity and thus reduced defect density, increased ease of manufacture, and reduced manufacturing cost.

These and other objects of the present invention are achieved by providing a method of forming a capacitor over bit line memory cell by: providing an array of substantially electrically isolated word lines atop a semiconductor wafer;

providing active areas about the word lines to define an array of memory cell field effect transistors (FETs), the active areas being defined by a first active region for electrical connection with a memory cell capacitor and a second active region for electrical connection with a bit line;

providing a first layer of electrically insulating material over the word lines and active regions, the layer of insulating material having an uppermost surface which is above the word lines;

providing first and second respective contact openings through the first insulating material layer to the first and second active regions;

providing a first layer of electrically conductive material over the first insulating material and within the first and second contact openings;

removing a portion of the first conductive material to outwardly expose remaining first insulating material, and to outwardly expose remaining first electrically conductive material within the first contact opening at an uppermost surface of said remaining first conductive material which is elevationally below the surface of the remaining first insulating material;

providing a second conductive layer and a bit line insulating material outwardly of the first layer of electrically conductive material;

providing a third layer of electrically conductive material having an uppermost surface above the bit line; and removing a portion of the third electrically conductive layer selective to the underlying bit line insulating material to form a capacitor storage node.

In another embodiment the present invention provides a method of forming a capacitor over bit line memory cell by:

providing a silicon semiconductor substrate having a word line and an active area;

providing a first insulating material layer over the word line and active area;

opening first and second contact holes through the first insulating layer to a first contact location and a second contact location of the active area;

providing a first conductive material layer over the first insulating material and within the first and second contact holes;

removing a portion of the first conductive material layer to expose an outward surface of the conductive material at an elevation below the elevation of the outward surface of the first insulating material to form a bit line contact above the first contact location and an isolated conductive material plug above the second contact location; and providing a capacitor atop the bit line contact and in electrical contact with the second active area through the plug.

According to another embodiment, the present invention provides a semiconductor processing method of forming a capacitor over bit line by:

providing a first and second opening in an insulating layer on a substrate;

providing an electrically conductive overlying layer to fill said first and second openings and form first and second electrically conductive pillars;

removing a portion of said first electrically conductive pillar to outwardly expose a surface of the first electrically conductive pillar which is elevationally below said insulating layer and second pillar;

capping said second pillar to form a bit line;

providing a second electrically conductive material over said bit line and in contact with said first pillar to form a capacitor storage node;

providing a dielectric layer over said storage node; and providing an electrically conductive outer capacitor plate atop said dielectric layer.

In yet another embodiment, the present invention provides a stacked capacitor memory cell comprising a semiconductor substrate having word lines with an insulating material overlaying the substrate and word lines except at bit line contact and storage node contact locations of the substrate;

a polysilicon bit line contact and polysilicon storage node contact in electrical communication with respective active areas of the substrate, wherein the contacts are electrically isolated from each other by the insulating material;

a silicided bit line in electrical communication with said bit line contact;

a periphery polysilicon plug in electrical communication with the bit line; and a capacitor above the bit line and in electrical communication with the storage node contact.

According to yet another embodiment, the present invention provides a stacked capacitor memory cell comprising a semiconductor substrate having word lines with an insulating material overlaying the substrate and word lines except at bit line contact and storage node contact locations of the substrate;

a polysilicon bit line contact and polysilicon storage node contact in electrical communication with respective active areas of the substrate, wherein said contacts are electrically isolated from each other by the insulating material;

a spacered and capped silicided bit line in electrical communication with the bit line contact;

a capacitor above the bit line and in electrical communication with the storage node contact, the capacitor comprising a dielectric and a hemispherical grain polysilicon material between the storage node and dielectric; and wherein the cell further comprises slots for periphery contacts within the polysilicon material of the bit line contact; and wherein the slots for periphery contacts, the bit line contact, and the capacitor storage node all comprise polysilicon, and the slots for periphery contacts are in direct electrical communication with the bit line.

Preferred embodiments of the invention are described below with reference to the following accompanying drawings.

DETAILED DESCRIPTION OF THE PREFERRED EMBODIMENT

Figure 1A:
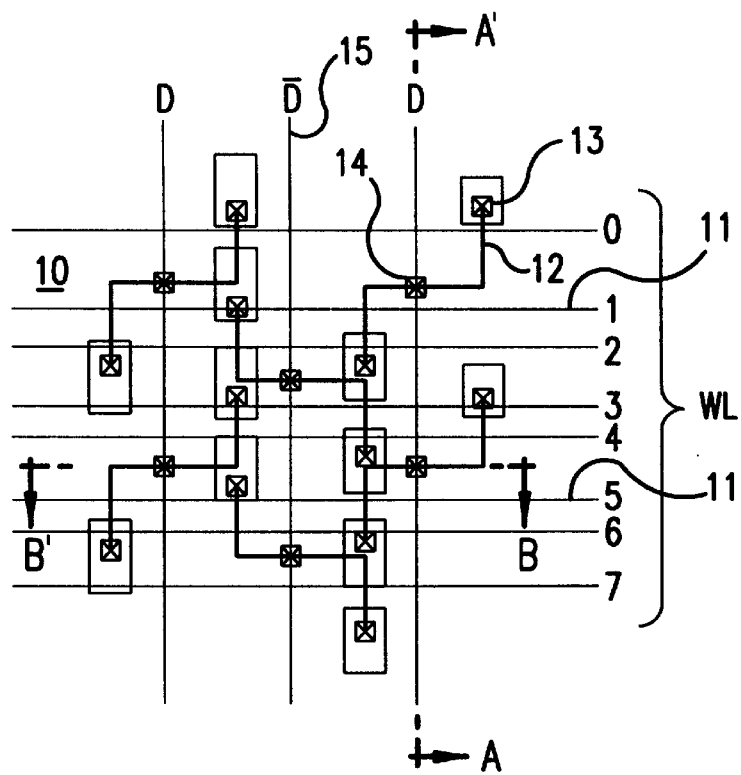
FIG. 1A is a top plan layout of a stacked-cell DRAM array.
Figure 1B:
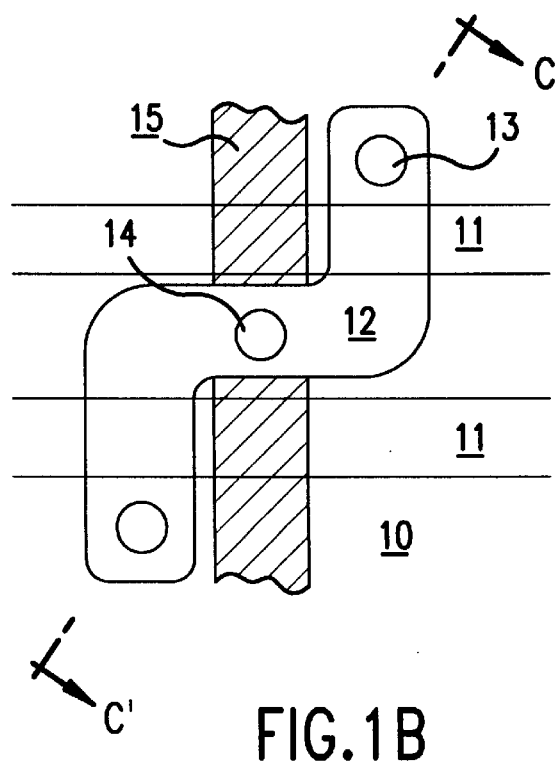
FIG. 1B is a schematic top plan layout of a single cell of the array of FIG. 1A. The subsequent drawing figures, which depict steps of the process of the invention, are cross-sectional views through locations of an in-process cell of the type shown by FIG. 1.

Referring to FIGS. 1A and 1B, a top plan layout of a completed stacked-cell DRAM array is depicted. The present invention, will be described in the context of the fabrication of an array having the same top plan layout as that depicted in FIGS. 1A and 1B. The subsequent figures, which depict steps of the process at various stages, are cross-sectional views taken at locations within the array represented as broken lines AA', BB' and CC'. The figures are not meant to be actual cross-sectional views of any particular portion of a real DRAM cell, but are merely convenient tools employed to more fully depict the process aspect of the invention at various stages of manufacture.

The completed stacked-cell DRAM array is fabricated on a silicon semiconductive substrate 10, typically a silicon semiconductive material. The term "substrates" herein shall be understood to mean one or more semiconductive layers or structures which include active or operable portions of semiconductor devices. A series of substantially parallel, spaced apart, polysilicon word lines 11, silicided with tungsten, titanium, or other refractory metal, traverses substrate 10, in which have been created a plurality of active areas 12 (the square S-shaped regions) which are insulated from one another by field oxide regions (not shown in this view). Each active area 12, which corresponds to the domain of a single memory cell, contains a storage node contact region 13 where that cell's storage node capacitor plate makes contact to the substrate within the cell's domain. Each cell domain has a single bit line contact region 14. Each of the substantially parallel, spaced-apart bit lines 15 makes contact with a plurality of bit line contact regions 14. Eventually, the bit lines and word lines will be connected to periphery contacts (not shown), which are located at the respective ends of the array and are capable of being in electrical communication with peripheral circuitry.

Figure 2:
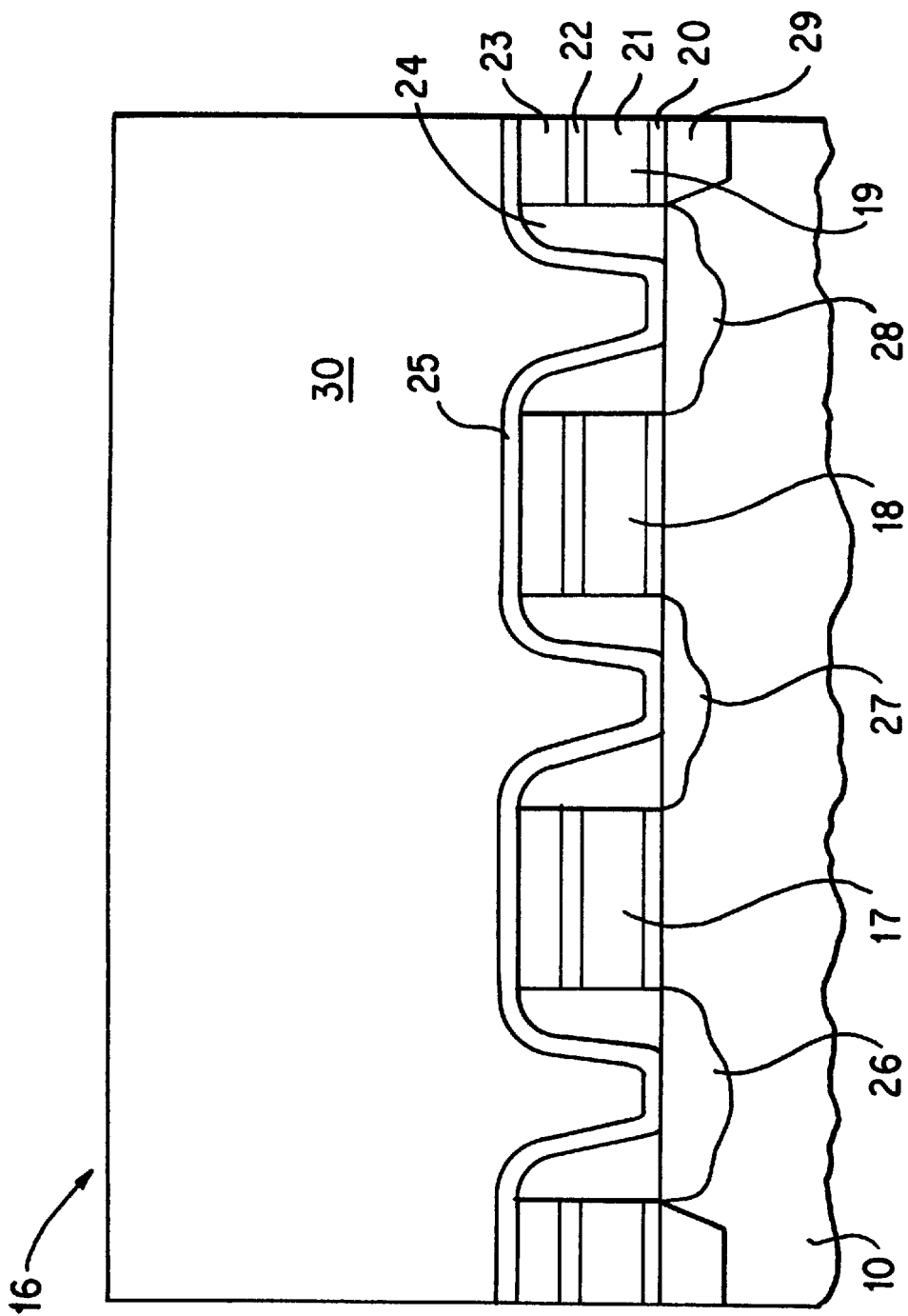
FIG. 2 is a sectional view of the semiconductor wafer fragment of FIG. 1B along section CC' at one processing step in accordance with the invention.

Referring to FIG. 2, a semiconductor wafer fragment is indicated generally by reference numeral 16. Wafer 16 is defined in part by silicon semiconductive substrate 10, and an array of substantially electrically isolated word lines, such as the illustrated word lines 17, 18 and 19. Such word lines have a lowermost gate oxide layer 20, a lower polysilicon layer 21, an overlying silicide layer 22 such as tungsten silicide, an insulating cap 23, and side insulating spacers 24. Spacers 24 and caps 23 preferably comprise an insulative nitride, such as $Si_3N_4$. A thin barrier layer 25 of $Si_3N_4$ (or, more preferably, tetraethylorthosilicate glass, TEOS) may be provided atop the wafer to function as a diffusion barrier. Layer 25 has a thickness which is preferably about 200 Angstroms to about 300 Angstroms when TEOS, and about 100 Angstroms to about 250 Angstroms when $Si_3N_4$.

Active regions are provided about the word lines, such as active regions 26, 27 and 28, to define an array of memory cell FETs. The discussion below proceeds with reference to an FET formed using word line 18, which will be provided with a capacitor construction for a single memory cell. Active region 28 will define a first active region for electrical connection with a memory cell capacitor. Active region 27 will define a second active region for electrical connection with a bit line. Field oxide 29 is provided, as shown.

Referring still to FIG. 2, a first insulating material layer 30 is blanket deposited over the word line 18 and active areas 27, 28, as shown. Preferred insulating materials for layer 30 are oxides, most preferably borophosphosilicate glass (BPSG). The deposition thickness of layer 30 is typically about 10,000 Angstroms. Layer 30 is preferably reflowed by heating to its glass transition temperature to densify the BPSG, and then polished to make a planarized surface.

Figure 3:
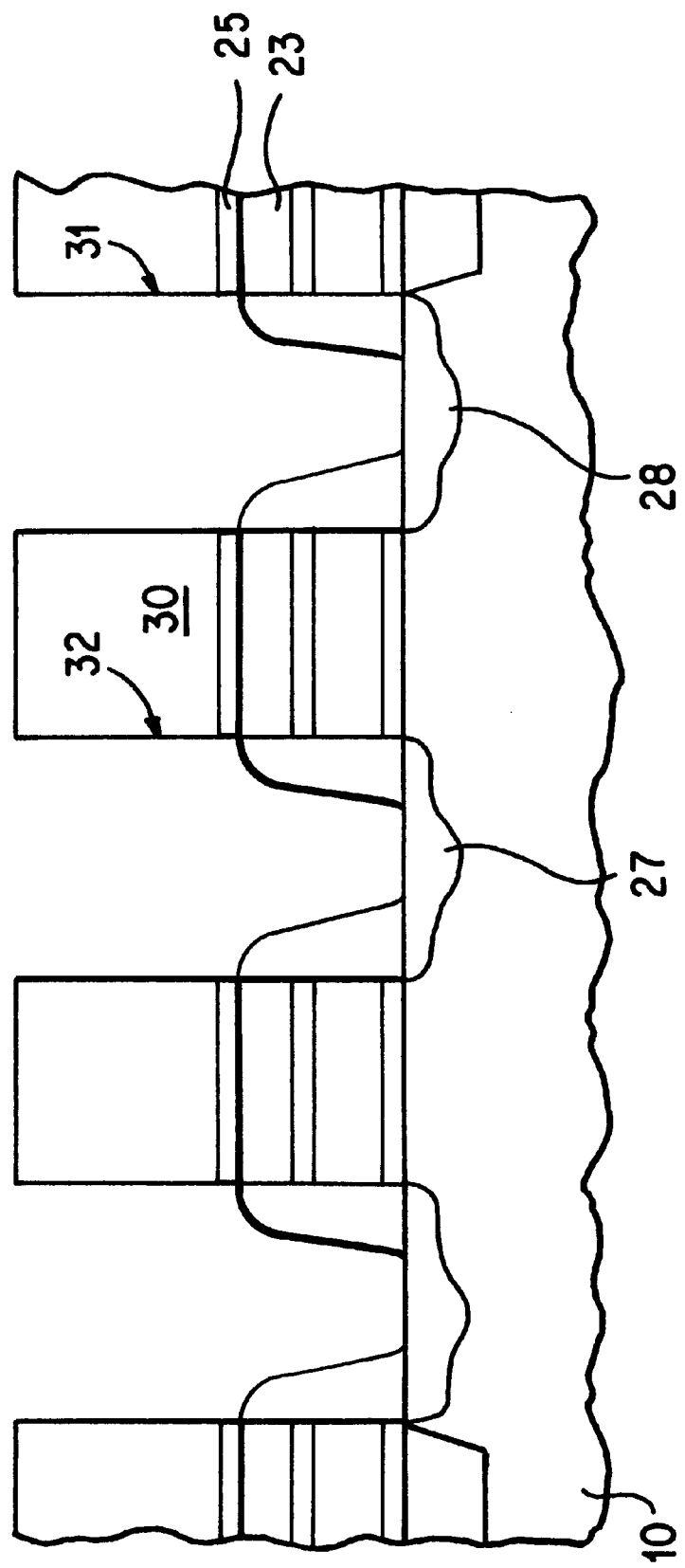
FIG. 3 is a view of the FIG. 2 wafer taken at a step subsequent to that shown by FIG. 2.

Referring to FIG. 3, a series of first contact openings 31 and second contact openings 32 are provided through first insulating material layer 30 to first and second active regions 28 and 27, respectively. Such openings would typically be formed by photomasking and dry etching of BPSG selectively relative to the nitride of the word line caps 23. An example etch chemistry would include $CHF_3$ and $O_2$ at low $O_2$ flow rate (i.e., less than 5% $O_2$ by volume in a $CHF_3/O_2$ mixture), or the combination of $CF_4$, Ar, $CH_2F_2$ and $CHF_3$. The principal purpose of optional barrier layer 25 is to minimize diffusion of boron or phosphorus atoms from BPSG layer 30 into active areas 27 and 28. Word line caps 23 are preferably comprised of nitride ($Si_3N_4$) and layer 30 is comprised of oxide, such that the etch to produce first contact openings 31 and 32 will stop relative to word line spacers 24 and caps 23.

Figure 4:
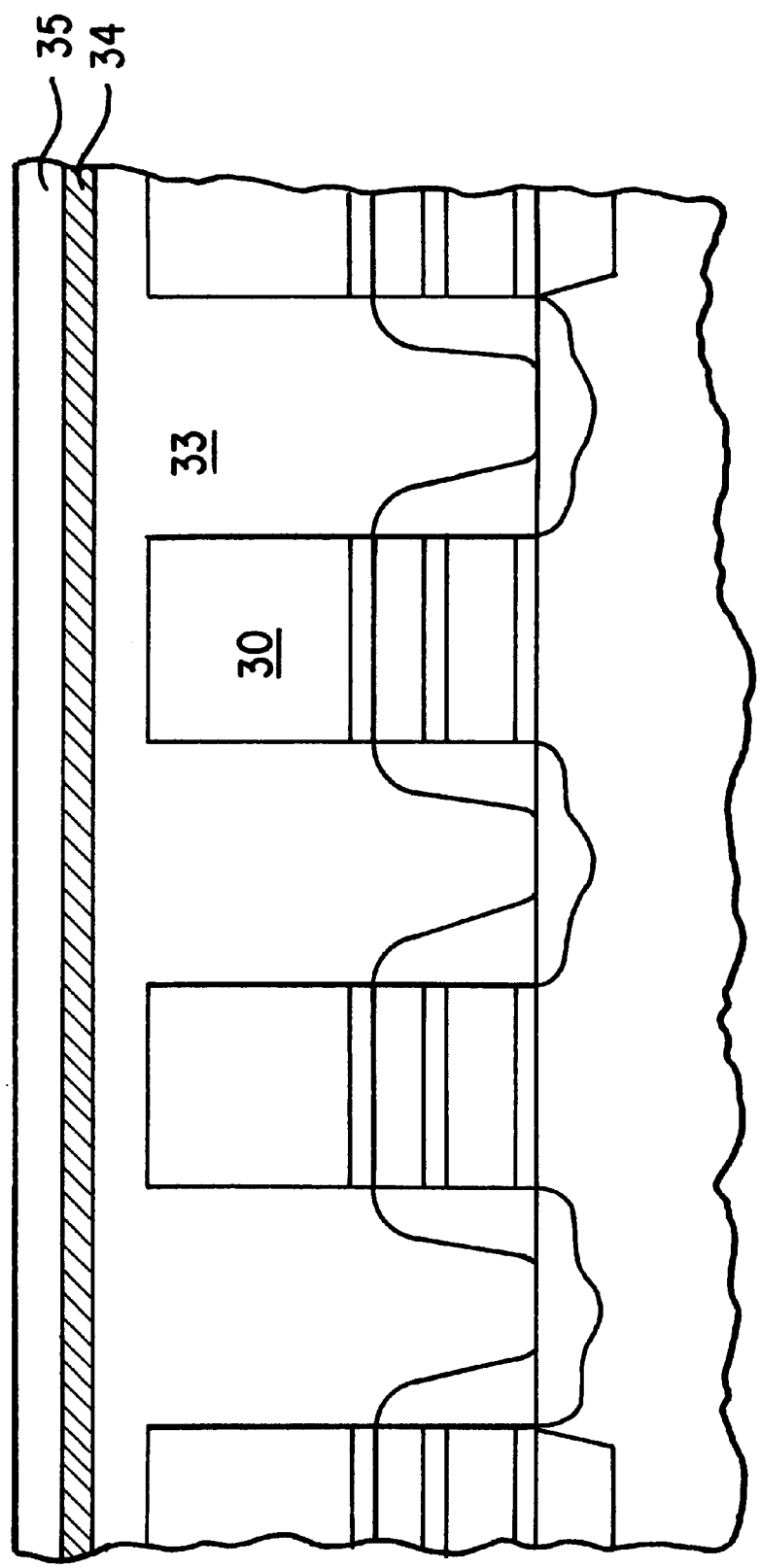
FIG. 4 is a view of the FIG. 2 wafer taken at a step subsequent to that shown by FIG. 3.

Referring to FIG. 4, the series of contact openings 31 and 32 are filled with a blanket deposition of a conductive material 33, preferably polysilicon, to a level above the outermost surface of the first insulating layer 30. A blanket silicide layer 34 (preferably $WSi_x$) is then applied continuously over the wafer on top of the conductive material 33. An insulating cap 35 is then layered on top of the silicide layer 34. The thickness of layers 33, 34 and 35 is typically about 3000, 1200 (or more), and 1900 Angstroms, respectively.

As an alternative to polysilicon for conductive layer 33, a metal may be used together with a barrier film. This is accomplished using one of several well-known techniques, such as depositing or sputtering a refractory metal silicide layer such as $WSi_x$, directly, or depositing a refractory metal (e.g. tungsten, titanium, or cobalt) layer on top of a first polysilicon layer and, then, annealing so that it reacts with the underlying polysilicon to form the silicide. In order to prevent the refractory metal silicide layer from separating from the first polysilicon layer during subsequent elevated temperature cycles, an optional silicon dioxide capping layer is deposited on top of silicide layer 34, following which an optional silicon nitride capping layer may be deposited on the top of the oxide capping layer.

Figure 5:
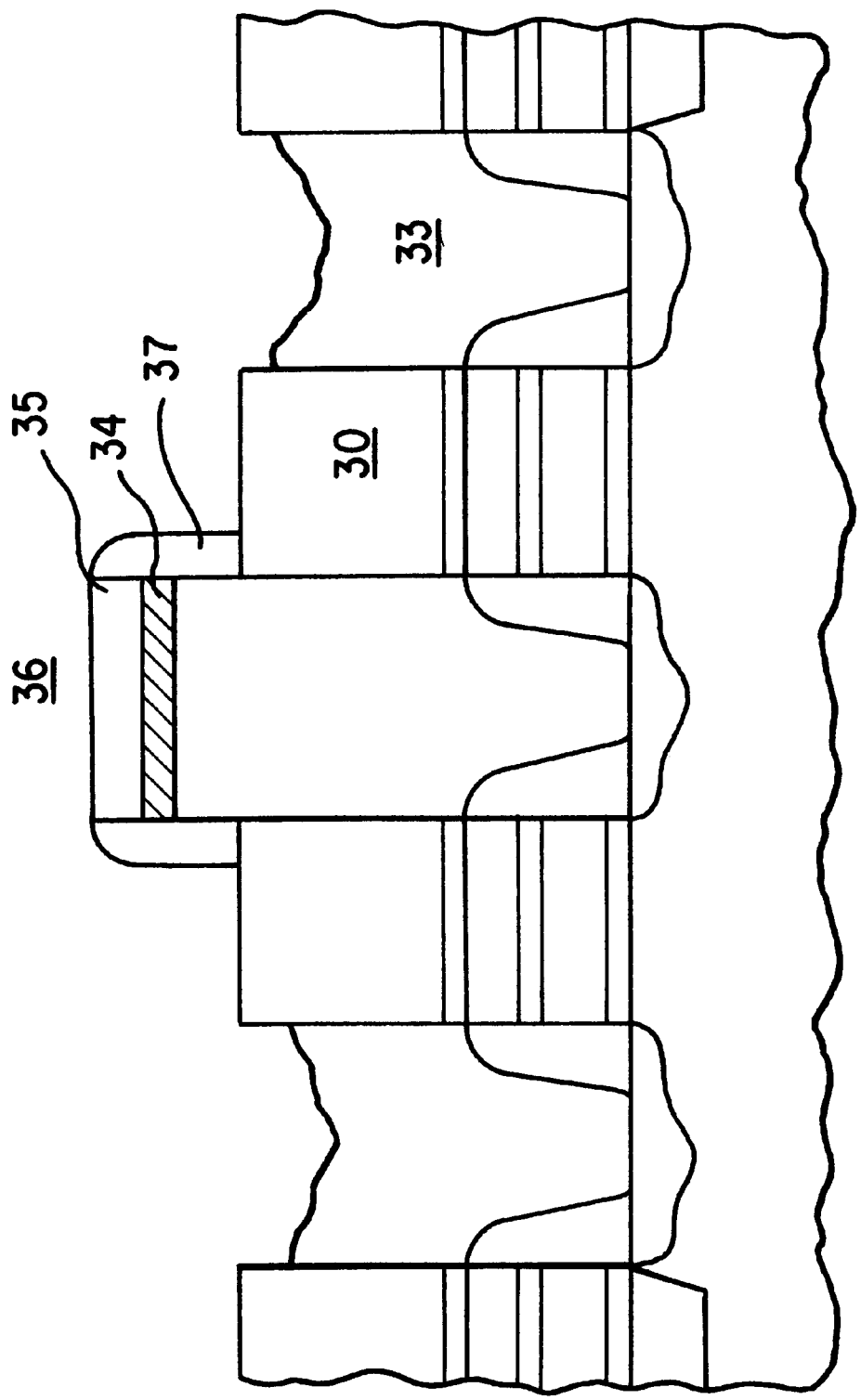
FIG. 5 is a view of the FIG. 2 wafer taken at a step subsequent to that shown by FIG. 4.

Referring to FIG. 5, the area defined as the bit line is masked with photoresist. The unmasked polysilicon conductive material layer 33, silicide ($WSi_x$) layer 34 and insulating cap layer 35 are etched back to remove them from over the insulating material 30. The polysilicon 33, silicide 34 and capping layer 35, which remain after the removal (etch), define bit line 36. In addition to forming bit line 36, the removal process isolates the future storage nodes, i.e., electrically conductive materials within the first 28, and second 27, contact areas are isolated because electrically conductive material 33 is etched back to an elevation that is below the outermost surface of the insulating material (BPSG) 30. The electrically conductive (polysilicon) material 33 remaining within contact area 28 defines a conductive plug for the capacitor to contact the active area of the substrate. The electrically conductive material 33 within contact area 27 defines a bit line contact for bit line 36, and can also be readily employed for slots in the periphery for shallower contacts (not shown). Accordingly, it is now apparent that the process of the present invention advantageously allows for the formation of three or more key structural features by a single masking and conductive material removal step; in addition, the bit line contact, plugs for the future capacitor, and plugs in the periphery, may all be formed by the same conductive material 33 in a single conductive material deposition step.

Figure 6A:
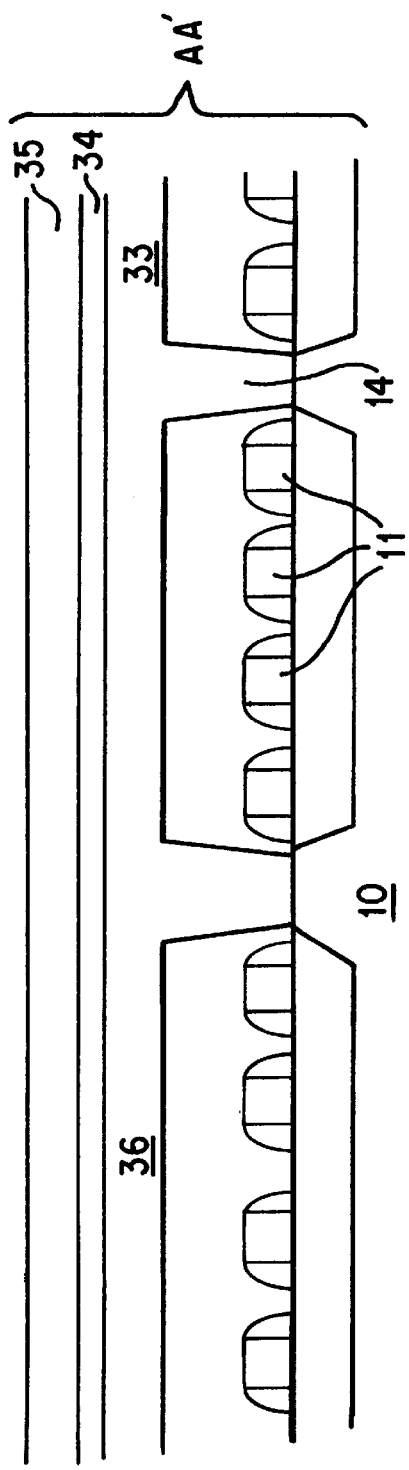
FIGS. 6A and 6B are cross-sectional views of the in-process array through broken lines AA' and BB', respectively, of FIG. 1A at the same step shown by FIG. 5.
Figure 6B:
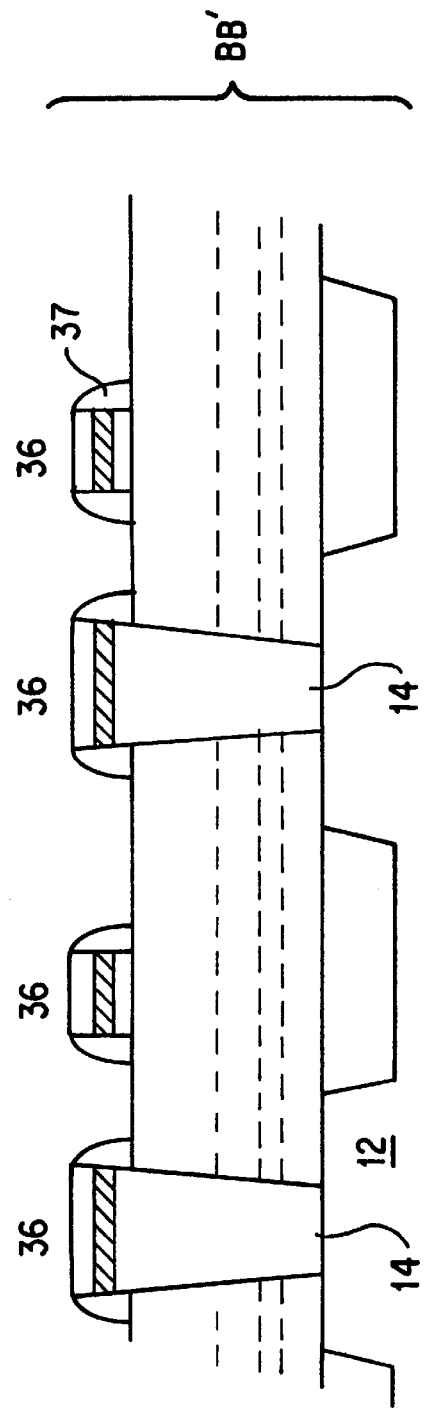

Referring still to FIG. 5, and as also shown from a different perspective by FIGS. 6A and 6B, the bit line 36 is then spacered with either oxide or nitride by depositing insulator spacer material 37, preferably silicon nitride ($Si_3N_4$), over the entire surface. Spacer oxide or nitride material 37 is preferably deposited by chemical vapor deposition (CVD), to a thickness of about 300 to 1500 Angstroms. Spacer material 37 is then removed with anisotropic etch, leaving only shoulders of spacer material 37 on the vertical surfaces of bit line 36.

FIG. 6A is a section along hatched line AA' of FIG. 1 and shows bit line 36 and bit contact 14, between a series of word lines 11 (FIGS. 1 and 6A), connecting bit line 36 to active area 12 of semiconductor substrate 10. Silicide layer 34, preferably $WSi_x$, forms a continuous planarized layer atop conductive material 33, and insulating cap layer 35, an oxide, forms a continuous planarized layer atop silicide layer 34, of bit line 36. FIG. 6B is a section along hatched line BB' of FIG. 1 and shows bit lines 36 including spacer material 37, and bit contact 14 to active area 12 of substrate 10; the hatched horizontal lines in FIG. 6B depict the gate oxide layer 20, polysilicon layer 21, silicide layer 22 and insulating caps 23 of word line 11 (FIGS. 1A and 6B).

Figure 6C:
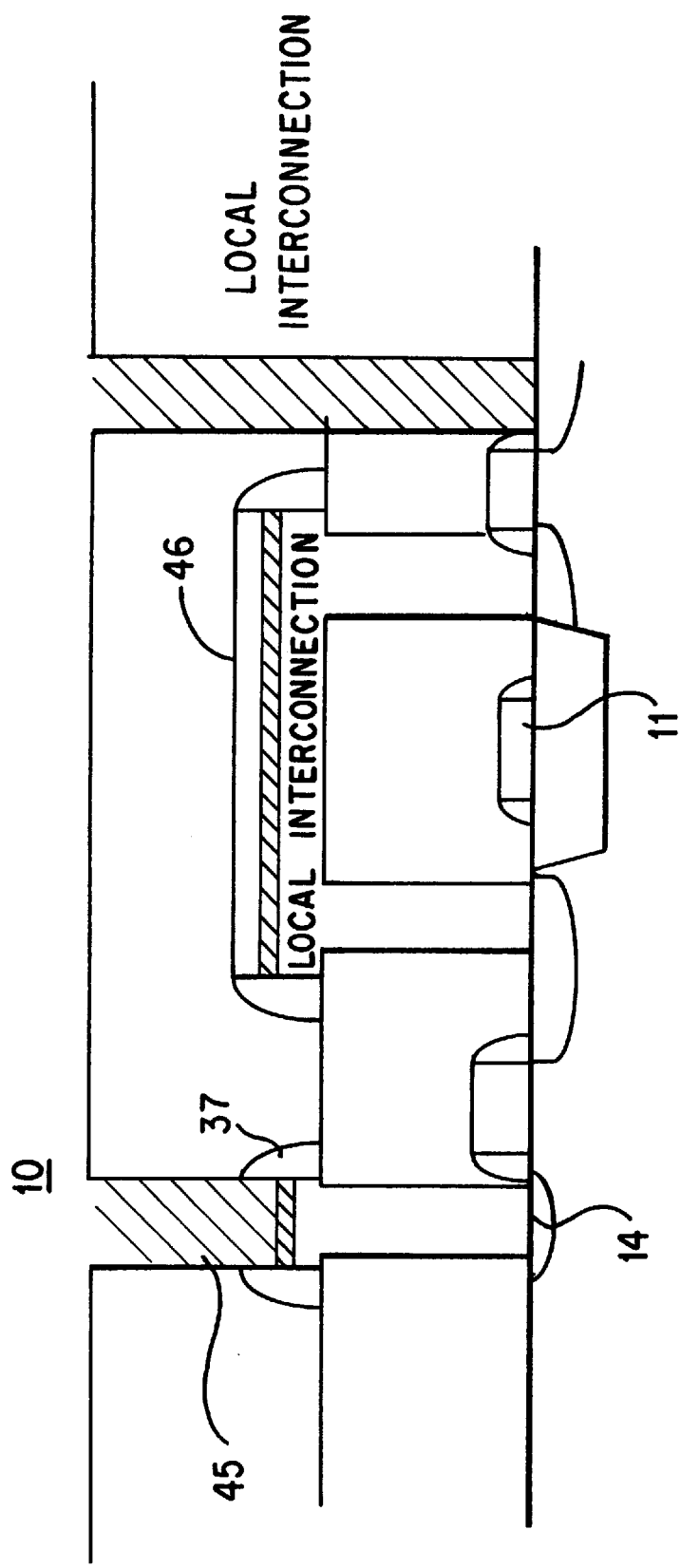
FIG. 6C is a view of the FIG. 2 wafer taken at a step subsequent to that shown by FIG. 5

At the in-process stage of the wafer fragments depicted in FIGS. 5 and 6, the silicided bit line is now formed, substantially simultaneously with formation of the conductive plugs for the future capacitors, as well as isolation of the capacitor storage nodes. FIG. 6C shows the wafer fragments of FIGS. 5 and 6 (A and B) after formation of a local interconnect 46. FIG. 6C also shows slot for periphery plug contact 45. Various capacitor structures can be formed atop the bit line and in electrical communication with the capacitor plugs by various capacitor fabrication techniques, including but not limited to, the capacitor block structure described below and depicted in FIG. 7.

Figure 7:
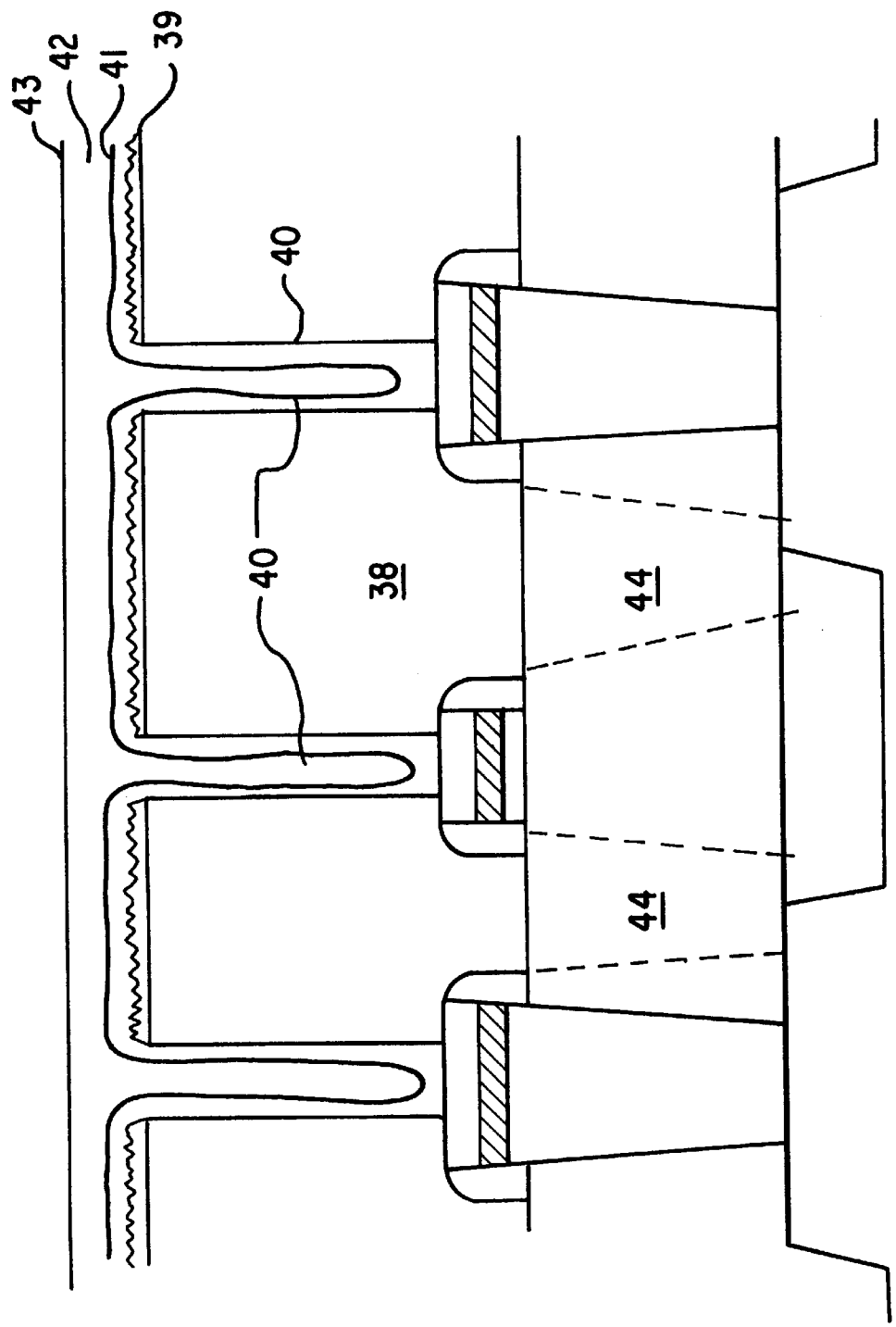
FIG. 7 is a view of the FIG. 6B wafer taken at a step subsequent to that shown by FIG. 6B.

Referring to FIG. 7, a polysilicon layer 38 is deposited. An optional rough layer 39 of rugged polysilicon, for example, hemispherical grain polysilicon (HSG), is then deposited atop layer 38 to increase surface area for improved capacitance. The preferred rugged polysilicon is combo HSG (CHSG) which is typically deposited by LPCVD to a thickness of from 300 to 1000 Angstroms. Islands are then formed by masking the capacitor areas, and polysilicon layer 38 is etched selective to the underlying spacer material 37, thus forming the lower capacitor plate (storage node) blocks 40 for the capacitors.

Next, a thin dielectric material layer 41, preferably $Si_3N_4$ or $Ta_2O_5$, is deposited over the capacitor storage nodes 40, and conductive outer layer (cell plate layer) 42 is then blanket deposited atop dielectric 41. The dielectric layer may typically have a thickness of about 25 to 150 Angstroms. Various suitable dielectric materials and combinations of these may be employed. Cell plate 42 is deposited thickly enough (preferably, 300 to 2000 Angstroms) to fill gaps between cells in order to make a planar surface 43.

Thus, a stacked capacitor DRAM cell is provided with a silicided bit line 36 formed while forming plugs 44 for the future capacitors, as well as plugs of slots 45 in the periphery for shallower contacts. The spacering of the bit line 36 allows for capacitor block etch to be selective to spacers 37. Various other capacitor structures and fabrication steps may be employed to form capacitors over bit line 36 and in contact with plugs 44. Although the process was depicted with reference to a block capacitor process flow, it may be easily adapted to a process utilizing container, cylindrical, double cylindrical, crown shaped, ring or vertical fin capacitors, as shown for example in U.S. Pat. No. 5,270,241. Such capacitors can be constructed in accordance with known processing techniques by one of ordinary skill in the art, given the capacitor plug and buried bit line processing techniques taught herein. For example, polysilicon layer 38 may be masked and etched to form a cylindrical capacitor with optional rugged polysilicon layer 39 then deposited on the sides, as opposed to the top surface, of the remaining polysilicon 38.

Finally, insulator glass is deposited, and a suitable back end metalization process such as a CMP-based process is used to connect up the devices. The array may now be completed using processing techniques that are well known in the art, including opening holes in the overlaying insulator glass to the polysilicon periphery plugs, metalizing the holes via tungston plugs or aluminum force fill, and then patterning and etching conductive lines on the surface to form local interconnects 46 (FIG. 6C). Although only a single embodiment of the process has been disclosed herein, it will be obvious to those having ordinary skill in the art that changes and modifications may be made to the process without departing from the scope and spirit of the invention as claimed. For example, the process of the invention may be performed to fabricate arrays having straight-line, as opposed to the S-shaped, active areas shown in FIG. 1. Similarly, other dielectric materials such as silicon dioxide, titanium oxide, yttrium oxide, barium strontium titanate, combinations of these, and others, may be used for dielectric 41, and other insulating materials, such as the above and various other oxides, may be substituted for the BPSG of layer 30. Additionally, materials other than HSG or CHSG (e.g., cylindrical grain poly (CGP)) may be substituted for rugged polysilicon layer 39.

Accordingly, it is to be understood that although the present invention has been described with reference to a preferred embodiment, various modifications, known to those skilled in the art, may be made to the structures and process steps presented herein without departing from the invention which is defined in the claims appended hereto.

We claim:

1. A method of forming a capacitor over bit line memory cell comprising the steps of:

providing an array of substantially electrically isolated word lines atop a semiconductor wafer;

providing active areas about the word lines to define an array of memory cell field effect transistors, the active areas being defined by a first active region for electrical connection with a memory cell capacitor, a second active region for electrical connection with a bit line, and a peripheral active region for peripheral electrical connection;

providing a first layer of electrically insulating material over the word lines and active regions, the layer of insulating material having an uppermost surface which is above the word lines;

providing first, second, and peripheral contact openings through the first insulating material layer to the first, second, and peripheral active regions;

providing a first layer of electrically conductive material over the first insulating material and within the first, second, and peripheral contact openings; and forming a bit line contact, a capacitor plug, and a peripheral plug in a single masking step by removing a portion of the first conductive material to outwardly expose remaining first insulating material, and to outwardly expose remaining first conductive material within the first and peripheral contact openings at an uppermost surface of said remaining first conductive material which is elevationally below the surface of the remaining first insulating material;

providing a second conductive layer and a bit line insulating material outwardly of the first layer of electrically conductive material;

providing a third layer of electrically conductive material having an uppermost surface above the bit line; and removing a portion of the third electrically conductive layer selective to the underlying bit line insulating material to form a capacitor storage node.

2. The method of claim 1 wherein the step of providing a first layer of electrically conductive material comprises a blanket deposition having a thickness which substantially fills the first, second, and peripheral contact openings and having a planarized uppermost surface above the first layer of electrically insulating material.

3. The method of claim 2 wherein the step of removing a portion of the first electrically conductive material comprises providing a patterned bit line contact in electrical communication with the second active region, and providing an isolated conductive capacitor plug in electrical communication with the first active region and a peripheral contact plug in contact with a peripheral active region.

4. The method of claim 1 wherein the step of providing a bit line insulating layer comprises spacering said bit line.

5. The method of claim 1 wherein said second conductive layer comprises a silicided bit line atop said first conductive material.

6. The method of claim 1 wherein said first insulating material comprises BPSG.

7. The method of claim 1 comprising the step of applying a rugged polysilicon layer on the surface of said storage node.

8. The method of claim 1 wherein said memory cell comprises a field effect transistor.

9. The method of claim 8 wherein said memory cell is a dynamic random access memory cell.

10. The method of claim 3 comprising the steps of depositing insulator glass over a cell plate, and opening holes in the insulator glass to the underlying peripheral plugs.

11. The method of claim 10 comprising the step of metalizing the holes in the insulator glass.

12. The method of claim 11 wherein said metalizing comprises providing a tungston or aluminum plug within said holes in the insulator glass.

13. The method of claim 11 further comprising the step of providing local interconnects by patterning and etching conductive lines on the surface of the cell.

14. A method of forming a capacitor over bit line memory cell comprising the steps of:

providing a silicon semiconductor substrate having a word line and an active area;

providing a first insulating material layer over the word line and active area;

opening first, second, and peripheral contact holes through the first insulating layer to a first contact location, a second contact location, and a peripheral contact location of the active area, respectively;

providing a first conductive material layer over the first insulating material and within the first, second, and peripheral contact holes;

removing a portion of the first conductive material layer to expose an outward surface of the conductive material at an elevation below the elevation of the outward surface of the first insulating material to substantially simultaneously form a bit line contact above the first contact location, an isolated conductive material plug above the second contact location, and an isolated conductive material above the peripheral contact location; and providing a capacitor atop the bit line contact and in electrical communication with the second active area through the plug.

15. The method of claim 14 comprising the step of providing a second conductive layer comprising a silicide atop said bit line contact to form a bit line.

16. The method of claim 15 comprising the step of capping and spacering said bit line with a second insulating material.

17. The method of claim 14 wherein said memory cell comprises a field effect transistor.

18. The method of claim 17 wherein said memory cell is a dynamic random access memory cell.

19. The method of claim 14 further comprising the step of providing local interconnections in electrical contact with said peripheral plugs.

20. A semiconductor processing method of forming a capacitor over a bit line comprising the following steps:

providing first, second, and peripheral openings in an insulating layer on a substrate;

providing an electrically conductive overlying layer to fill said first, second and peripheral openings and form first, second, and peripheral electrically conductive pillars;

removing a portion of said first and peripheral electrically conductive pillars to outwardly expose a surface of the first and the peripheral electrically conductive pillars which are elevationally below said insulating layer and second pillar;

capping said second pillar to form a bit line;

providing a second electrically conductive material over said bit line and in contact with said first pillar to form a capacitor storage node;

providing a dielectric layer over said storage node; and providing an electrically conductive outer capacitor plate atop said dielectric layer.

21. A method according to claim 20 wherein said capping step comprises providing a silicide layer and then an insulating layer atop said second pillar.

22. A method according to claim 21 further comprising spacering said bit line.

23. A method according to claim 22 further comprising the step of removing a portion of said second conductive material selective to said underlying bit line spacers.

24. A method according to claim 20 comprising the step of providing a layer of rugged polysilicon between said storage node and dielectric.

* * * * *